United States Patent [19]

Iwamura

[11] Patent Number: 5,604,752
[45] Date of Patent: Feb. 18, 1997

[54] COMMUNICATION METHOD AND APPARATUS THEREFOR

[75] Inventor: Keiichi Iwamura, Kawasaki, Japan

[73] Assignee: Canon Kabushiki Kaisha, Tokyo, Japan

[21] Appl. No.: 363,957

[22] Filed: Dec. 27, 1994

[30] Foreign Application Priority Data

Dec. 29, 1993 [JP] Japan .................................... 5-354518

[51] Int. Cl.$^6$ ................................................. H03M 13/00
[52] U.S. Cl. ............................................................. 371/37.1
[58] Field of Search ................................. 371/37.1, 37.3, 371/37.4, 37.7, 37.8; 364/265.2, 259.9, 942.8, 966

[56] References Cited

U.S. PATENT DOCUMENTS

| | | | |
|---|---|---|---|
| 4,649,541 | 3/1987 | Lahmeyer | 371/37 |
| 5,323,402 | 6/1994 | Vaccaro et al. | 371/37.1 |

FOREIGN PATENT DOCUMENTS

WO8501625  4/1985  WIPO ............................ H03M 13/00

OTHER PUBLICATIONS

Proceedings. The Twenty–Second International Symposium On Multiple–Valued Logic, Sendai, Japan, 27.–29.051992, 27 May 1992, IEEE, Los Alamitos, US pp. 138–145, XP356432 K. Araki/M. Takada, M. Morii: "On the efficient decoding of Reed–Solomon codes based on GMD criterion." based on GMD criterion p. 143; Fig. 2B; p. 144, Fig. 1E.

IEEE Transactions On Information Theory, vol. 38, No. 6, Nov. 1992, New York US pp. 1801–1807, XP323296 M. Morii/M. Kasahara: "Generalized Key–Equation of Remainder Decoding Algorithm for Reed–Solomon Codes.", p. 1801, left col., paragraph 4—right col., paragraph 1, p. 1803, left col., paragraph 3–paragraph—4.

Electronics Letters., vol. 29, No. 11, 27 May 1993, London GB p. 1031, XP372940 W. G. Chambers: "Solution of Welch–Berlekamp Key Equation by Euclidean Algorithm.", the whole document.

"Continued Fractions and Berlekamp's Algorithm", IEEE Trans. Inf. Theory, L. R. Welch and R. A. Scholtz, IT–25, pp. 19–27, Jan. 1979. Moriit Araki, Recursive Structure of Welch–Berlekamp Algorithm (IT 91–100).

IEICE Transactions On Fundamentals Of Electronics, Communications and Computer Sciences, vol. E76–A, No. 1, Jan. 1993, Tokyo JP pp. 132–138, XP358867, K. Araki/M. Takada/M. Morii: "On a Recursive Form of Welch–Berlekamp Algorithm.", *p. 132, right col., line 27—p. 133, left col., line 38*, *p. 135, Appendix I, Step 3)*.

IEICE Transactions On Information and Systems, vol. E76–D, No. 5, May 1993, Japan 1993, pp. 594–604, XP322129, K. Araki/M. Takada/M. Morii: "The Efficient GMD Decoders for BCH Codes.", p. 596; Fig. 1, p. 597, Fig. 1E, p. 602, left col., lines 6–9 p. 602, left col., lines 17–18.

Reports of the IEICE IT–91 (1991–05) (In Japanese), vol. 91, No. 28, 14 May 1991, Japan, 1991, pp. 7–12, M. Morii/K. Araki: "On GMD Decoding Using Remainder Decoding Algotithm.", abstract, p. 10, left col., p. 11 left col, paragraph 2.

*Primary Examiner*—Roy N. Envall, Jr.
*Assistant Examiner*—Karen D. Presley
*Attorney, Agent, or Firm*—Fitzpatrick, Cella, Harper & Scinto

[57] ABSTRACT

A decoder of a communication apparatus includes a CPU which controls decoding processing, and a memory which stores a decoding processing program. The decoding processing program includes a syndrome polynomial generating unit which generates a syndrome polynomial on the basis of a received word, a polynomial updating unit which updates an error locator polynomial and an error evaluator polynomial, which are set using the generated syndrome polynomial, on the basis of a degree of the error locator polynomial, and a decoded sequence generating unit which generates a decoded sequence on the basis of the error locator polynomial and the error evaluator polynomial, thus decoding communication codes at a high speed with a minimal computational complexity.

9 Claims, 10 Drawing Sheets

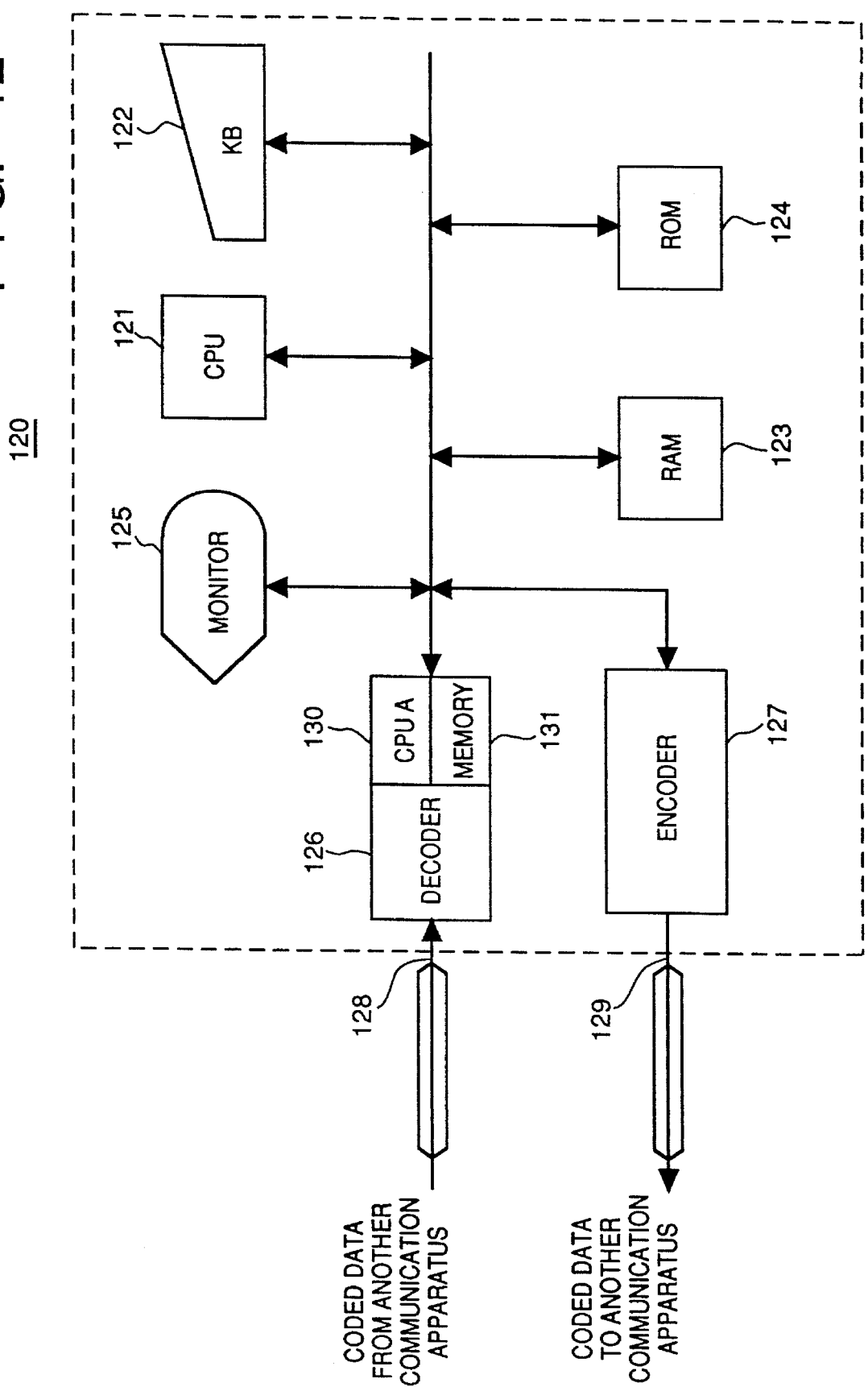

COMMUNICATION METHOD AND APPARATUS THEREFOR

BACKGROUND OF THE INVENTION

1. Field of the Invention

The present invention relates to a communication method and apparatus, which corrects, at a receiving side, a data error caused by a communication path or a storage medium in a digital communication system and a digital storage system.

2. Description of the Related Art

Decoding methods of error-correcting codes can be classified into hard decision decoding methods and soft decision decoding methods. A hard decision decoding method is a method of performing error correction for a digital sequence obtained by hard-deciding a reception signal to "0" and "1". Since the arrangement of a decoder is simple, this method is widely used for various media such as a CD (Compact Disk).

On the other hand, in a soft decision decoding method, an analog weight indicating a probability of a digital sequence obtained by soft-deciding a reception signal is calculated in addition to the digital sequence, and error correction is performed by utilizing the analog weight. For this reason, this method sufficiently brings out the capability of error-correcting codes, and improves the S/N ratio by about 2 to 3 dB as compared to the hard decision decoding method.

A GMD (Generalized Minimum Distance) decoding method to be described below is one of the soft decision decoding methods, and is known as a decoding method which almost performs maximum likelihood decoding using an analog weight. If the minimum distance of codes is represented by d, the conventional GMD decoding corrects a maximum of (d-1) errors, and realizes error correction about twice the correction capability obtained by a single hard decision decoding cycle.

However, since the GMD decoding requires a maximum of (d-1)/2 hard decision decoding cycles, a larger computational complexity is required than the hard decision decoding method which requires only a single decoding cycle, resulting in a large calculation circuit scale and a long calculation time.

SUMMARY OF THE INVENTION

The present invention has been made in consideration of the above-mentioned prior art, and has as its object to provide a communication method apparatus which has a minimum computational complexity and realizes high-speed decoding.

It is another object of the present invention to provide a communication method and apparatus which decode communication codes at a high speed.

The above-mentioned objects are achieved by the following communication apparatus or method.

More specifically, according to one aspect of the present invention, there is provided a communication apparatus comprising:

syndrome polynomial generating means for generating a syndrome polynomial on the basis of a received word;

polynomial updating means for updating an error locator polynomial and an error evaluator polynomial, which are set using the generator syndrome polynomial, on the basis of a degree of the error locator polynomial; and decoded sequence generating means for generating a decoded sequence on the basis of the error locator polynomial and the error evaluator polynomial.

According to another aspect of the present invention, there is provided a communication apparatus comprising:

syndrome polynomial generating means for generating a syndrome polynomial on the basis of a received word;

polynomial updating means for updating an error locator polynomial and an error evaluator polynomial, which are set using the generated syndrome polynomial, on the basis of an erasure position of the received word; and decoded sequence generating means for generating a decoded sequence on the basis of the error locator polynomial and the error evaluator polynomial.

According to still another aspect of the present invention, there is provided a communication method comprising:

a syndrome polynomial generating step of generating a syndrome polynomial on the basis of a received word;

a polynomial updating step of updating an error locator polynomial and an error evaluator polynomial, which are set using the generated syndrome polynomial, on the basis of a degree of the error locator polynomial; and a decoded sequence generating step of generating a decoded sequence on the basis of the error locator polynomial and the error evaluator polynomial.

According to still another aspect of the present invention, there is provided a communication method comprising:

a syndrome polynomial generating step of generating a syndrome polynomial on the basis of a received word;

a polynomial updating step of updating an error locator polynomial and an error evaluator polynomial, which are set using the generated syndrome polynomial, on the basis of an erasure position of the received word; and a decoded sequence generating step of generating a decoded sequence on the basis of the error locator polynomial and the error evaluator polynomial.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the present invention and, together with the description, serve to explain the principles of the invention.

FIG. 12 is a block diagram for explaining an example of the arrangement of a communication apparatus according to the fourth embodiment of the present invention.

DESCRIPTION OF THE PREFERRED EMBODIMENTS

Figure 1:
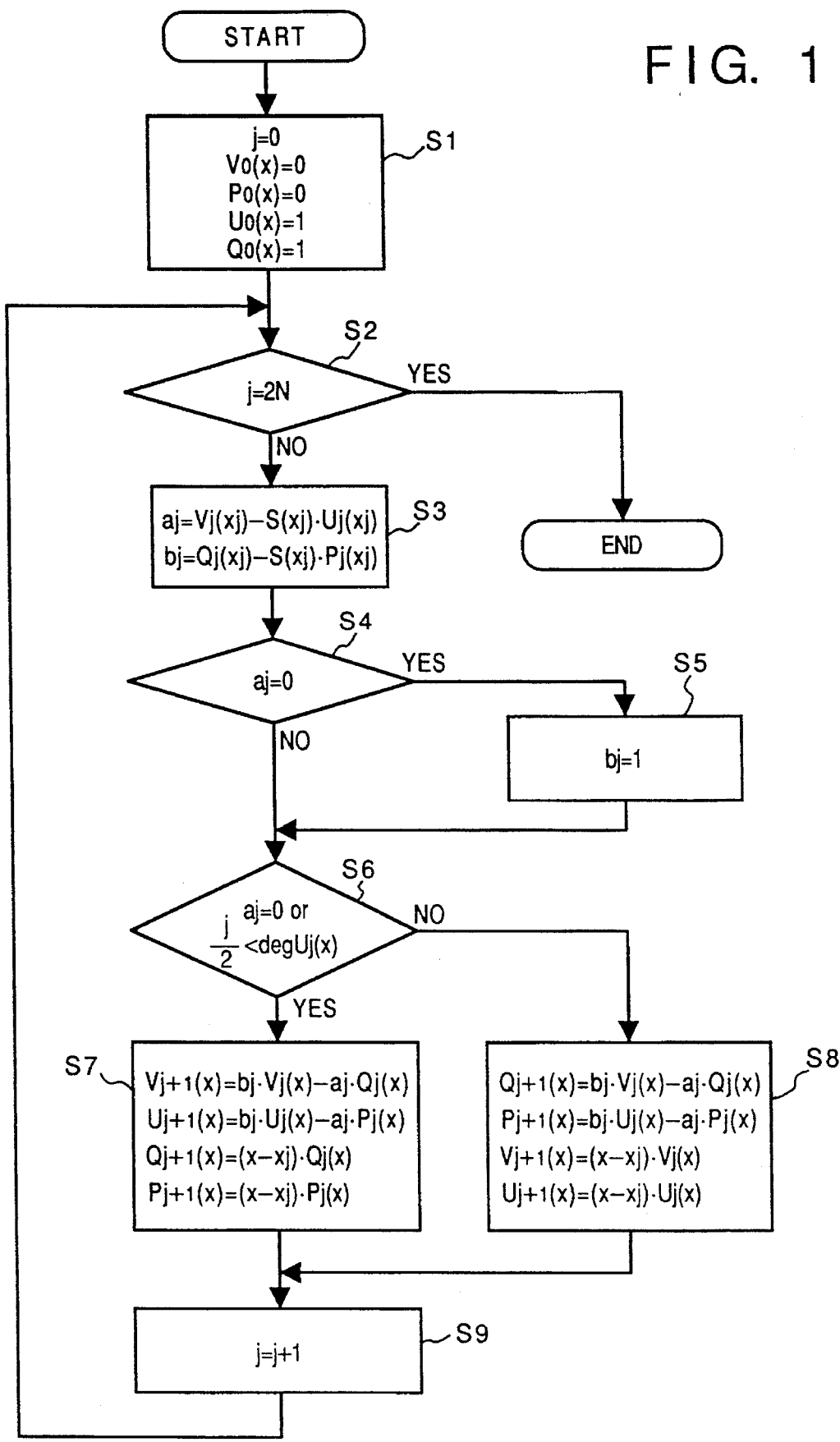
FIG. 1 is a flow chart for explaining decoding processing according to the first embodiment of the present invention.

Preferred embodiments of the present invention are described below in detail in accordance with the accompanying drawings.

(First Embodiment)

A GMD decoding method and an apparatus therefor according to the first embodiment of the present invention is described below. First, an outline of the GMD decoding method is briefly described below, and thereafter, a description of the main subject is given.

[Outline of GMD Decoding Method]

Analog weights which respectively represent probabilities of symbols in a received sequence $R=(R_0, R_1, \ldots, R_{n-1})$ having a code length n are represented by $\theta=(\theta_0, \theta_1, \ldots, \theta_{n-1})$. Note that $0 \leq \theta_i \leq 1$, and if $\theta_i > \theta_j$, a symbol $R_i$ in the received sequence R has a higher reliability than $R_j$.

A function x(a, b) is defined by:

$$x(a, b): 1 \text{ if } a=b: -1 \text{ if } a \neq b \quad (1)$$

An inner product R·C of the received sequence $R=(R_0, R_1, \ldots, R_{n-1})$ and a code word $C=(C_0, C_1, \ldots, C_{n-1})$ obtained by decoding the received sequence R is defined as follows:

$$R \cdot C = \sum_{i=0}^{n-1} \theta_i \cdot x(Ri, Ci) \quad (2)$$

At this time, it has already been proved that a received sequence R which satisfies the following inequality can be accurately corrected.

$$R \cdot C > n-d \quad (3)$$

where d is the minimum distance of C.

When processing consisting of the following four steps is repetitively executed a finite number of times, a received sequence R which satisfies inequality (3) can be determined, and accurately corrected:

Step 1: A test sequence R' is generated by setting j (initial value is 0) symbols in the order from smallest analog weights in the received sequence R to be erasure symbols, and hard-decision-processing other symbols.

Step 2: A code word C' is obtained by hard-decision decoding the test sequence R'. If the test sequence cannot be corrected, the control advances to step 4.

Step 3: It is discriminated if the inner product R'·C' of the test sequence R' and the code word C' satisfies inequality (3). If the inequality is satisfied, the code word C is output; otherwise, the control advances to step 4.

Step 4: "j=j+2" is performed, and the control returns to step 1. If j>d, this means that an error exceeding error-correcting capability has occurred, and decoding ends.

In this manner, the GMD decoding corrects a maximum of (d-1) errors, and realizes error correction about twice the correction of capability by a single hard decision decoding cycle. However, since the GMD decoding requires a maximum of (d-1)/2 hard decision decoding cycles, a larger computational complexity is required than the hard decision decoding method which requires only a single decoding cycle, and this method is not often used in practice.

For this reason, E. R. Berlekamp proposed a remainder decoding method which is executed by using a remainder polynomial obtained by dividing a received sequence by a generator polynomial of codes, and suggested a possibility of a great decrease in computational complexity required for the GMD decoding if the remainder decoding method is applied to the GMD decoding. Furthermore, E. R. Berlekamp proposed the following algorithm, called a Welch-Berlekamp (WB) algorithm, which efficiently executes remainder decoding. Since then, Morii, Araki, et. al. proved that a maximum of (d-1) errors could be corrected, i.e., the GMD decoding could be performed by a maximum of two cycles of the remainder decoding method, and verified the possibility of the decrease in computational complexity required for the GMD decoding suggested by E. R. Berlekamp.

[WB Alogorithm]

$j = 0, V_0(x) = 0, P_0(x) = 0, U_0(x) = 1, Q_0(x) = 1$     1)
if $j = 2N$ then end     2)
$aj = Vj(xj) - S(xj) \cdot Uj(xj)$     3)
$bj = Qj(xj) - S(xj) \cdot Pj(xj)$
if $aj = 0$ then $bj = 1$
if $\deg(aj \cdot Qj(x)) < \deg(bj \cdot Uj(x))$ then     4)
  $V_{j+1}(x) = bj \cdot Vj(x) - aj \cdot Qj(x)$
  $U_{j+1}(x) = bj \cdot Uj(x) - aj \cdot Pj(x)$
  $Q_{j+1}(x) = (x - xj) \cdot Qj(x)$
  $P_{j+1}(x) = (x - xj) \cdot Pj(x)$
else
  $Q_{j+1}(x) = bj \cdot Vj(x) - aj \cdot Qj(x)$
  $P_{j+1}(x) = bj \cdot Uj(x) - aj \cdot Pj(x)$
  $V_{j+1}(x) = (x - xj) \cdot Vj(x)$
  $U_{j+1}(x) = (x - xj) \cdot Uj(x)$
$j = j + 1$ goto 2)     5)

However, decoding processing based on the algorithm of the conventional GMD decoding does not consider the computational complexity for degrees.

Figure 2:
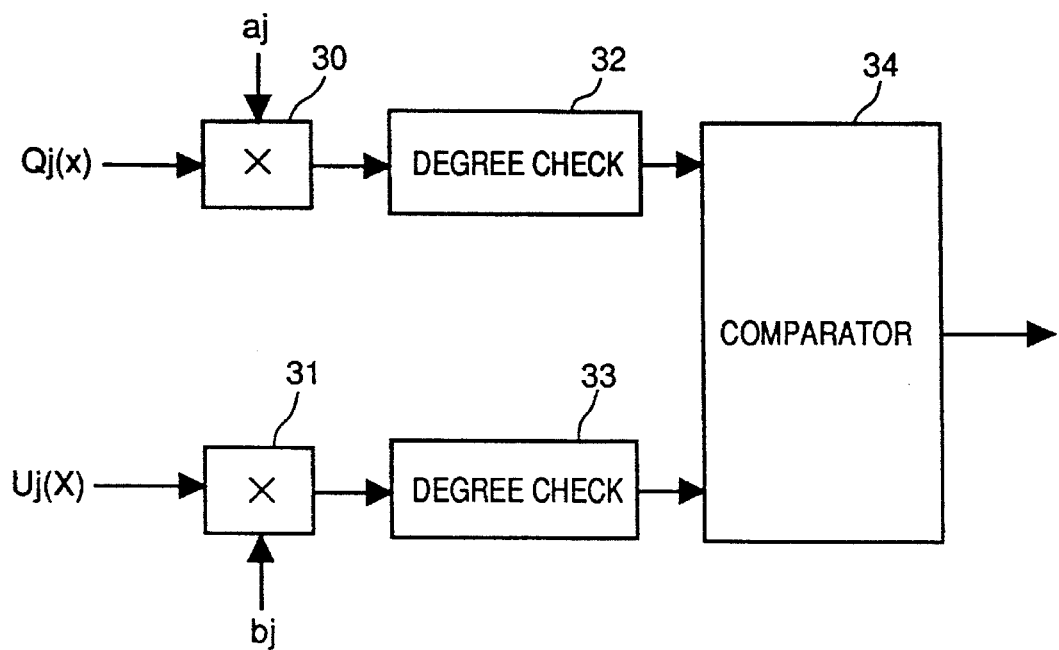
FIG. 2 is a block diagram for explaining the arrangement of a degree calculation circuit based on a WB algorithm.

The decoding processing based on the WB algorithm requires two multipliers 30 and 31 for respectively performing multiplications with aj and bj and two degree check circuits 32 and 33 for checking the degree of polynomials Uj(x) and Qj(x), as shown in FIG. 2, so as to perform a discrimination according to formula (4) below.

In the first embodiment, a discrimination method in the decoding processing, which realizes the abovementioned degree check circuits of the two polynomials by a degree check circuit of a single polynomial is described.

Note that this technique is applied to decoding processing based on a recursive WB algorithm (to be described later), and decoding processing with a minimum computational complexity as a whole is realized.

The discrimination method in the decoding processing which is realized by a degree check circuit of a polynomial as a feature of the first embodiment is described below.

Morii & Araki, "Recursive Structure of Welch-Berlekamp Algorithm (IT91-100)" describes that the following formula is established for the WB algorithm:

$$\deg\ Uj(x)+\deg\ Qj(x)=j$$

By modifying this formula, we have:

$$\deg Qj(x)=j-\deg Uj(x) \qquad (4)$$

In the conditional formula (4), since aj and bj do not influence the degree of the polynomials if they are not 0, the conditional formula can be rewritten as:

$$a_j=0 \text{ or } \deg Qj(x)<\deg Uj(x) \qquad (5)$$

When formula (4) is substituted in conditional formula (5), we have:

$$a_j=0 \text{ or } j/2<\deg Uj(x) \qquad (6)$$

Since $a_j=0$ is checked at the end of formula (3), the computational complexity is not increased. Since the value j is checked upon updating in formula (5), the check required in formula (6) is the degree of the polynomial Uj(x). Therefore, the computational complexity associated with the degree in the discrimination in formula (4) is decreased.

The decoding processing method of the first embodiment is described below with reference to the flow chart in of FIG. 1. This decoding processing method achieves calculations at a higher speed by a smaller number of circuit components than the conventional WB algorithm since it need not check the degree of the polynomial Qj(x).

Assume that a p-element Galois field is represented by GF(p). Processing procedures for decoding a Reed-Solomon code using the following generator polynomial on the GF(p) is explained below.

$$G(x)=(x-\alpha^b)\cdot(x-\alpha^{b+1})\ldots(x-\alpha^{b+d-2})$$

where α: primitive element on GF (p)
d: minimum distance of codes
b: arbitrary integer In step S1, a variable j for counting the number of times of processing is initialized, i.e., "j=0". Also, an error locator polynomial Uj (x) and an auxiliary error locator polynomial Pj(x) are initialized to "0", and an error evaluator polynomial Vj (x) and an auxiliary error evaluator polynomial Qj(x) are initialized to "1".

In step S2, the variable j for counting the number of times of processing of first decoding processing is compared with a value twice a value N for determining the upper limit value of a predetermined number of times of processing. If j=2N, the first decoding processing ends. Otherwise, the flow advances to step S3.

Note that N means the error-correcting capability of codes.

In step S3, a scalar quantity aj is calculated from the error evaluator polynomial Vj (x), the error locator polynomial Uj(x), and a syndrome polynomial S(x), Also, a scalar quantity bj is calculated from the auxiliary error evaluator polynomial Qj (x), the auxiliary error locator polynomial Pj(x), and the syndrome polynomial S(x).

Note that the syndrome polynomial S(x) is obtained by calculating the following formulas:

$$S(x)=\sum_{i=0}^{n-1} R_i \cdot a^{b \cdot i} \cdot (T(x)-T(a^i))/(x-a^i)$$

$$T(x)=(x-x_0)\cdot(x-x_1)\ldots(x-x_{2N-1})$$

where $R_i(i=0,\ldots,n-1)$ is a received word having a code length n. xj (j=0, . . ., 2N–1) is an element on the GF(p), which represents the position of a received symbol which has a low reliability level and is set to be an erasure error. Also, xj is numbered by j in the order of lower reliability levels. By substituting xj in turn in the error evaluator polynomial Vj (xj), the error locator polynomial Uj (xj), the error evaluator polynomial Qj(xj), the error locator polynomial Pj(xj), and the syndrome polynomial S(xj), the two scalar quantities aj and bj are calculated. Note that it is checked in step S4 if aj=0, and if aj=0, the flow advances to step S5 to set bj=1.

In step S6, it is checked if aj="0" or the degree of Uj(x) is larger than "j/2". If this condition is not satisfied, the flow advances to step S8 to calculate "j+1"-th degree polynomials $V_{j+1}(x)$, $U_{j+1}(x)$, $Q_{j+1}(x)$, and $P_{j+1}(x)$.

In step S7, "j+1"-th degree polynomials $V_{j+1}(x)$, $U_{j+1}(x)$, $Q_{j+1}(x)$, and $P_{j+1}(x)$ are calculated from j-th degree polynomials, and aj and bj.

In step S9, j is incremented by 1, and the processing from step S2 is repeated.

With the above-mentioned processing, Reed-Solomon codes are decoded by simpler calculations than in the decoding method using the conventional WB algorithm.

Figure 3:
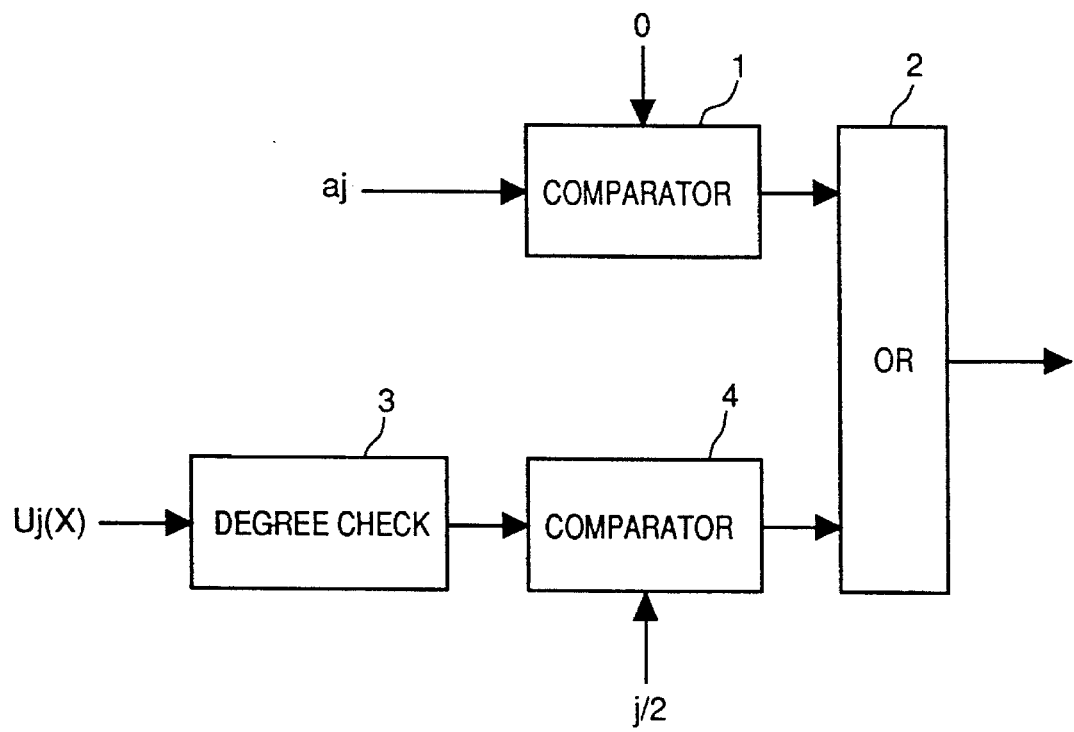
FIG. 3 is a block diagram for explaining the arrangement of a degree calculation circuit of the first embodiment.

Note that the discrimination processing in step S6 can be realized by, e.g., the circuit arrangement shown in FIG. 3. Referring to FIG. 3, a comparator 1 corresponding to "aj=0" is a 0 detection circuit, and is very easily realized by, e.g., an EX-OR gate. Also, an OR circuit 2 is realized by a 1-bit OR gate. Therefore, only one degree check circuit for the polynomial Uj(x) is required, resulting in a simple circuit. Similarly, when the processing is realized in a software manner, the degree checking is realized with a reduced computational complexity. The superiority of this arrangement is clearly recognized upon comparison with the circuit shown in FIG. 2. Referring to FIG. 2, since the multipliers 30 and 31 perform multiplications on the Galois field, they require a complicated circuit arrangement as compared to a multiplication of integers. Since two degree check circuits and two multipliers are required, the circuit scale is undesirably large. In contrast to this, the circuit shown in FIG. 3 does not require any multipliers, and requires only one degree check circuit 3, thus realizing a remarkably simple arrangement as compared to the circuit arrangement shown in FIG. 2.

As described above, according to the first embodiment, high-speed decoding processing is realized by simple calculations as compared to decoding processing based on the conventional WB algorithm.

(Second Embodiment)

In the second embodiment, a second decoding processing method which achieves high-speed decoding by simple calculations as compared to a recursive WB algorithm obtained by modifying the WB algorithm (see Morii & Araki, "Recursive Structure of Welch-Berlekamp Algorithm (IT91-100)") is described below.

The recursive WB algorithm is as follows.

Note that the recursive WB algorithm decreases the total computational complexity as compared to the WB algorithm.

[Recursive WB Algorithm]
$j = 0, L = 0, L' = 0,$ \hfill 10)

$$P=\begin{bmatrix} 1 & 0 \\ 0 & 1 \end{bmatrix}, D=\begin{bmatrix} A & 0 & (x) \\ B & 0 & (x) \end{bmatrix} = \begin{bmatrix} -S & (x) \\ & 1 \end{bmatrix}$$

-continued

```
if j = 2N then end                                      20)
aj = Aj(xj)                                             30)
bj = Bj(xj)
if aj = 0 then bj = 1
if deg(aj · x^L') < deg(bj · x^L') then                 40)
```

$$Y = \begin{bmatrix} bj & -aj \\ 0 & (x-xj) \end{bmatrix}$$

$L' = L' + 1$
else $$Y = \begin{bmatrix} (x-xj) & 0 \\ -bj & aj \end{bmatrix}$$

```
Δ = Y · Δ                                               50)
P = Y · P
j = j + 1 goto 20)                                      60)
```

In the decoding processing method of the second embodiment, a decrease in total computational complexity by decreasing the number of variables in calculations is the main objective.

Figure 5:
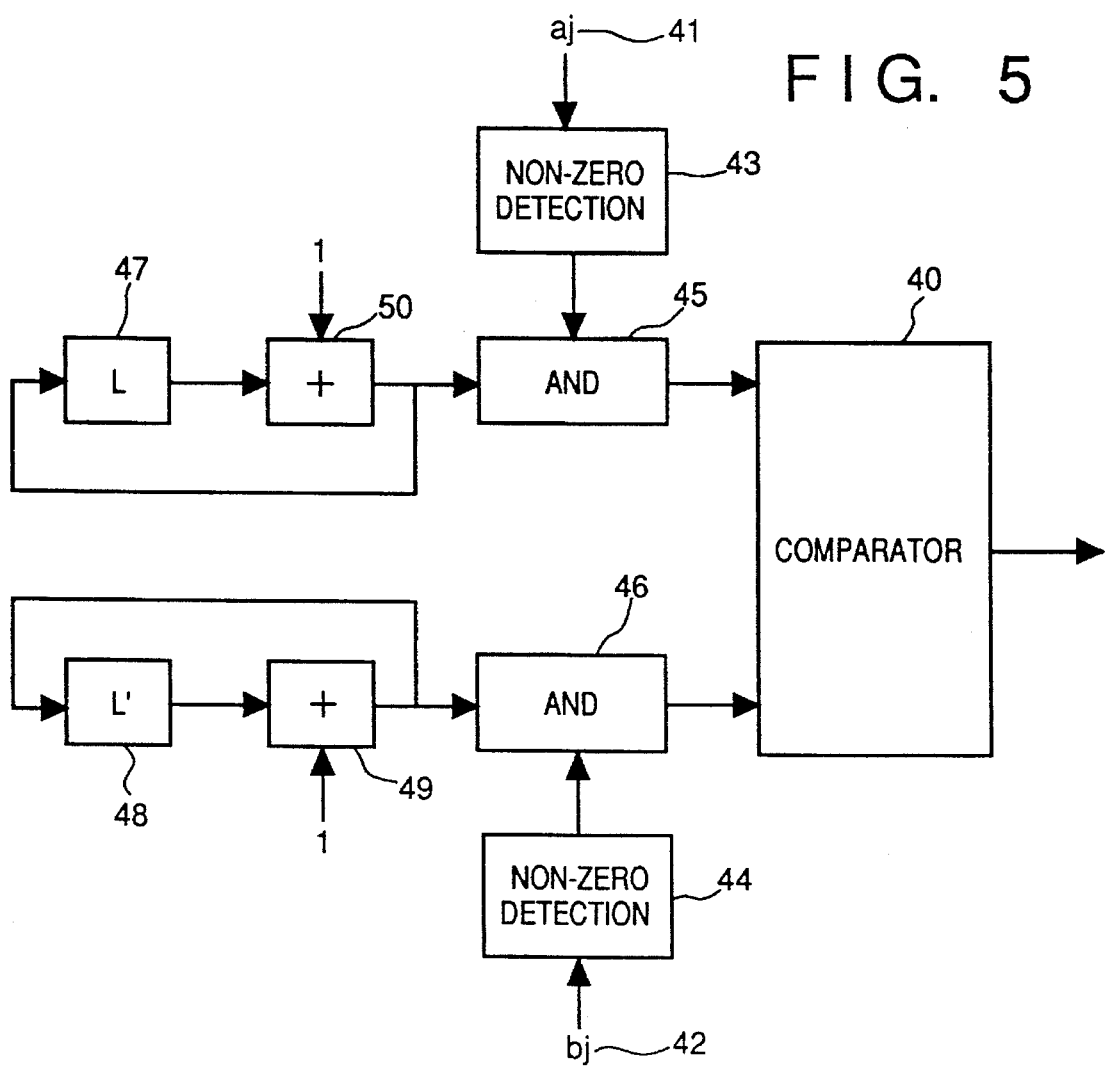
FIG. 5 is a block diagram for explaining the arrangement of a degree calculation circuit based on a recursive WB algorithm.

The decoding processing based on the recursive WB algorithm adopts the circuit arrangement for supporting discrimination processing in 40), as shown in FIG. 5. Referring to FIG. 5, reference numerals 47 and 48 denote registers for respectively storing temporary values of L and L'. Adders 50 and 49 respectively increment L and L' stored in the registers 47 and 48 by 1. Non-zero detection circuits 43 and 44 are circuits for respectively detecting if values aj and bj are non-zero. If these values are non-zero, the values are supplied to AND circuits 45 and 46, and are logically ANDed to the output values L and L' from the adders 50 and 49, respectively. Note that the outputs from the AND circuits 45 and 46 are values indicating the degrees of aj·$x^L$ and bj·$x^L$. These degrees are compared by a comparator 40, and a comparison result is output.

Figure 4:
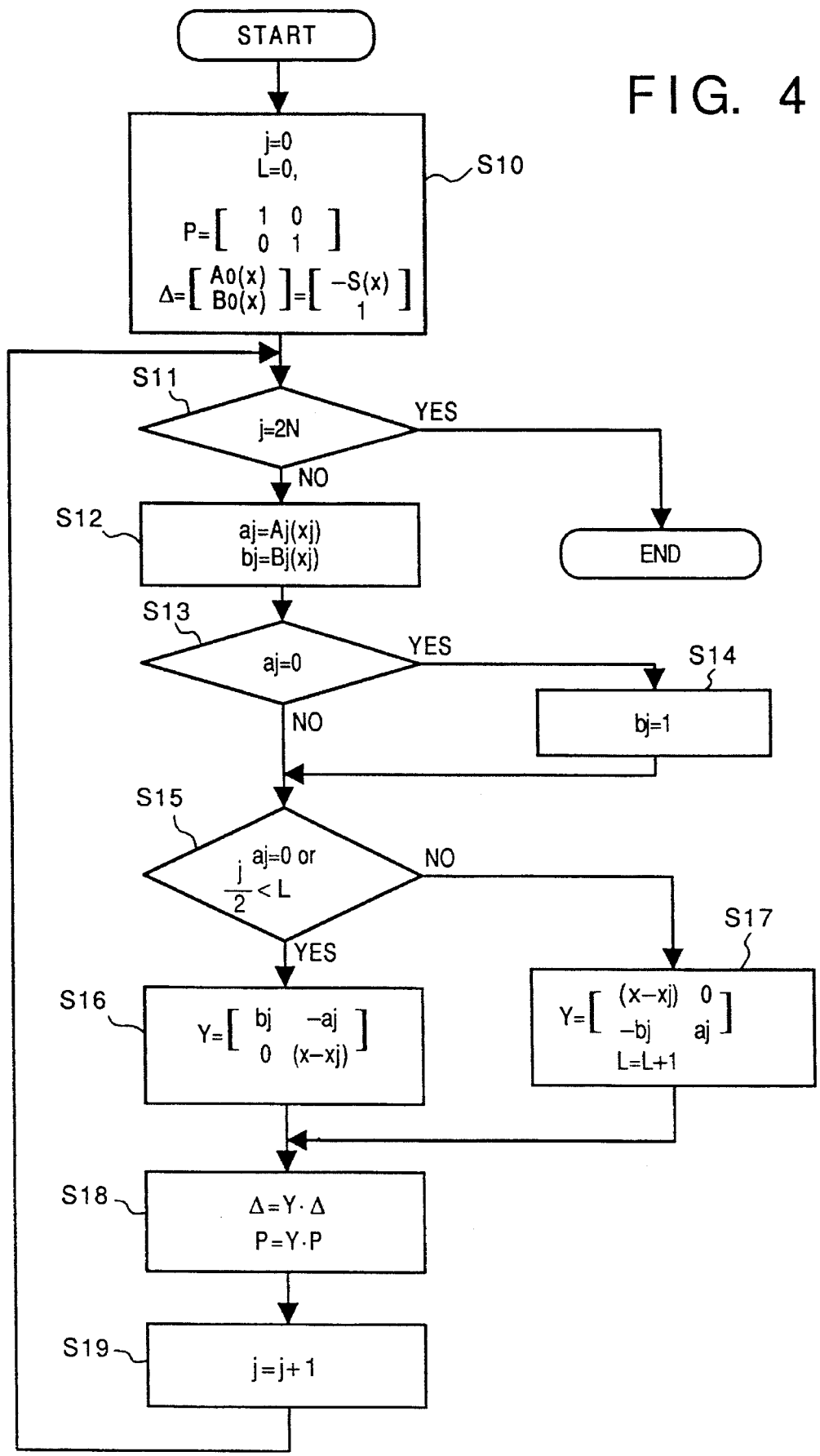
FIG. 4 is a flow chart for explaining decoding processing according to the second embodiment of the present invention.

The decoding processing method of the second embodiment executes decoding processing based on the recursive WB algorithm at a higher speed by simpler calculations, and is described below with reference to the flow chart in FIG. 4.

In the decoding processing method of the second embodiment, a calculation associated with L' corresponding to the degree of a polynomial Qj(x) need not be performed as compared to the decoding processing based on the recursive WB algorithm.

In step S10, a variable j for counting the number of times of processing is initialized, i.e., "j=0". Also, an error locator polynomial Uj(x) and an auxiliary error locator polynomial Pj(x) are initialized to "0", and an error evaluator polynomial Vj(x) and an auxiliary error evaluator polynomial Qj(x) are initialized to "1". Assume that Pj(x), Qj(x), uj(x), and Vj(x) are expressed as elements of a matrix P. L representing the degree of each of the polynomials Qj(x) and Uj(x) is initialized to "0".

Furthermore, the following polynomials for calculating aj and bj by substituting xj are introduced, and are expressed as elements of a matrix Δ:

Aj(x)=Vj(x)−S(x)·Uj(x)

Bj(x)=Qj(x)−S(x)·Pj(x)

Note that Δ has the following initial values by substituting the initial values of the polynomials:
$A_0(x) = -S(x)$ $B_0(x) = 1$ In step S11, the variable j for counting the number of times of processing of second decoding processing is compared with a value twice a value N for determining the upper limit value of a predetermined number of times of processing. If j=2N, the second decoding processing ends. Otherwise, the flow advances to step S12.

Note that N means the error-correcting capability of codes.

In step S12, aj and bj are obtained by substituting xj in Aj(x) and Bj(x). Note that it is checked in step S13 if aj=0, and if aj=0, the flow advances to step S14 to set bj=1.

It is checked in step S15 if aj is "0" or L is larger than "j/2". If L is smaller than "j/2", the flow advances to step S16. Otherwise, the flow advances to step S17 to set a matrix Y as follows, and to increment L by 1:

$$Y = \begin{bmatrix} (x-xj) & 0 \\ -bj & aj \end{bmatrix}$$

In step S16, the matrix Y is set as follows:

$$Y = \begin{bmatrix} bj & -aj \\ 0 & (x-xj) \end{bmatrix}$$

In step S18, updating calculations of the matrices P and Δ are performed.

In step S19, j is incremented by 1, and processing steps from step S11 are executed.

Decoded data are generated based on the error locator polynomial and the error evaluator polynomial which are obtained, as described above.

With the above-mentioned processing, Reed-Solomon codes are decoded by simpler calculations than in the decoding method using the conventional recursive WB algorithm.

Figure 6:
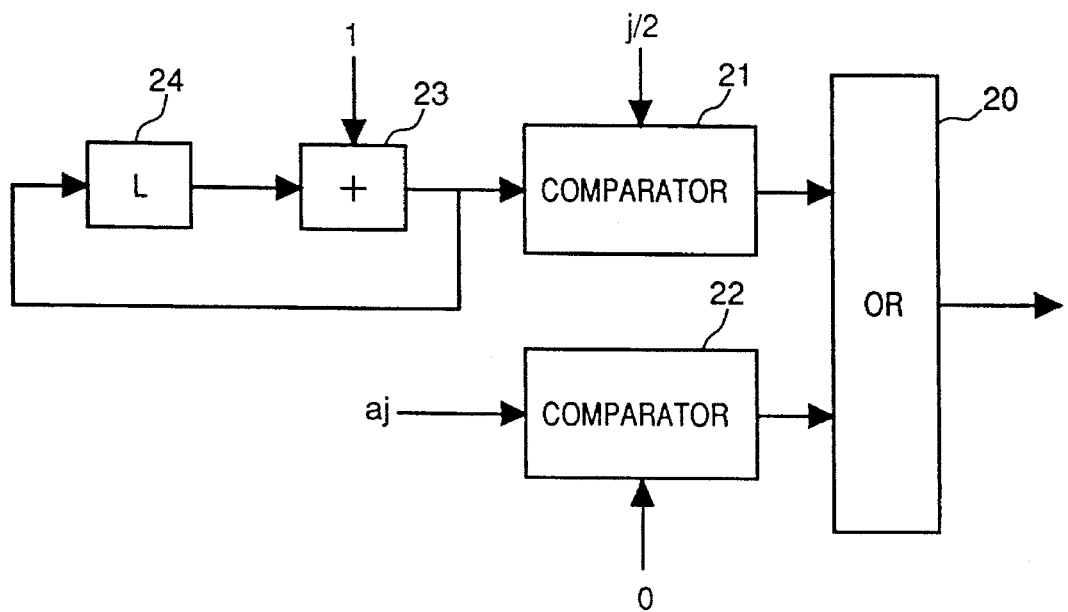
FIG. 6 is a block diagram for explaining the arrangement of a degree calculation circuit of the second embodiment.

The discrimination processing in step S15 in the second decoding processing method is realized by, e.g., the circuit arrangement shown in FIG. 6. Referring to FIG. 6, a comparator 22 compares aj and "0", and outputs the comparison result to an OR circuit 20. A register 24 stores a temporary value L. This L is incremented by an adder 23, and is output to a comparator 21 and the register 24. The register 24 stores the incremented value L. On the other hand, the comparator 21 compares the incremented value L and "j/2", and outputs the comparison result to the OR circuit 20. The OR circuit 20 receives the outputs from the comparators 21 and 22, logically ORs these outputs, and outputs a calculation result.

As can be seen from a comparison between the circuit arrangement of degree processing based on the recursive WB algorithm shown in FIG. 5, and the degree processing circuit of the second embodiment, degree processing is realized by a smaller circuit with a reduced computational complexity. More specifically, from the circuit arrangement for degree processing based on the recursive algorithm, at least the register 48 and the adder 49 associated with L' can be omitted.

Note that the technique for decreasing the computational complexity associated with the degree is effective not only for the above-mentioned WB algorithm and the recursive WB algorithm, but also for other algorithms having the relations of formulas (4) and (5).

In formula (4), the degree of Qj(x) is expressed by the degree of Uj(x). Alternatively, the degree of Uj(x) can be expressed by the degree of Qj(x) as follows:

$$\deg Uj(x) = j - \deg Qj(x) \tag{7}$$

Therefore, the conditional formula in step S15 is also expressed as follows:

$$aj=0 \text{ or } j/2 > \deg Qj(x) \tag{8}$$

In this case, in place of the degree (L') of Qj(x), checking (calculation) of the degree (L) of Uj(x) is omitted.

Pj(x) and Uj(x) represent error locator polynomials, and Qj(x) and Vj(x) represent error evaluator polynomials. Since Qj(x) is no longer related to control of the algorithm according to the present invention, if error evaluator polynomials are not necessary, as in BCH codes, Qj(x) and Vj(x) is omitted, and the computational complexity can be further decreased.

As described above, in the decoding processing method of the second embodiment, the computational complexity associated with the degree can be decreased, and a GMD decoding algorithm with a minimum total computational complexity is realized. When error evaluator polynomials are not necessary like in BCH codes, Qj(x) and Vj(x) need not be calculated, and the computational complexity is further decreased.

(Third Embodiment)

In the third embodiment, a new decoding method which allows high-speed calculations, based on parallel processing, of the WB algorithm, which cannot be conventionally achieved by parallel processing, is described below.

Figure 7:
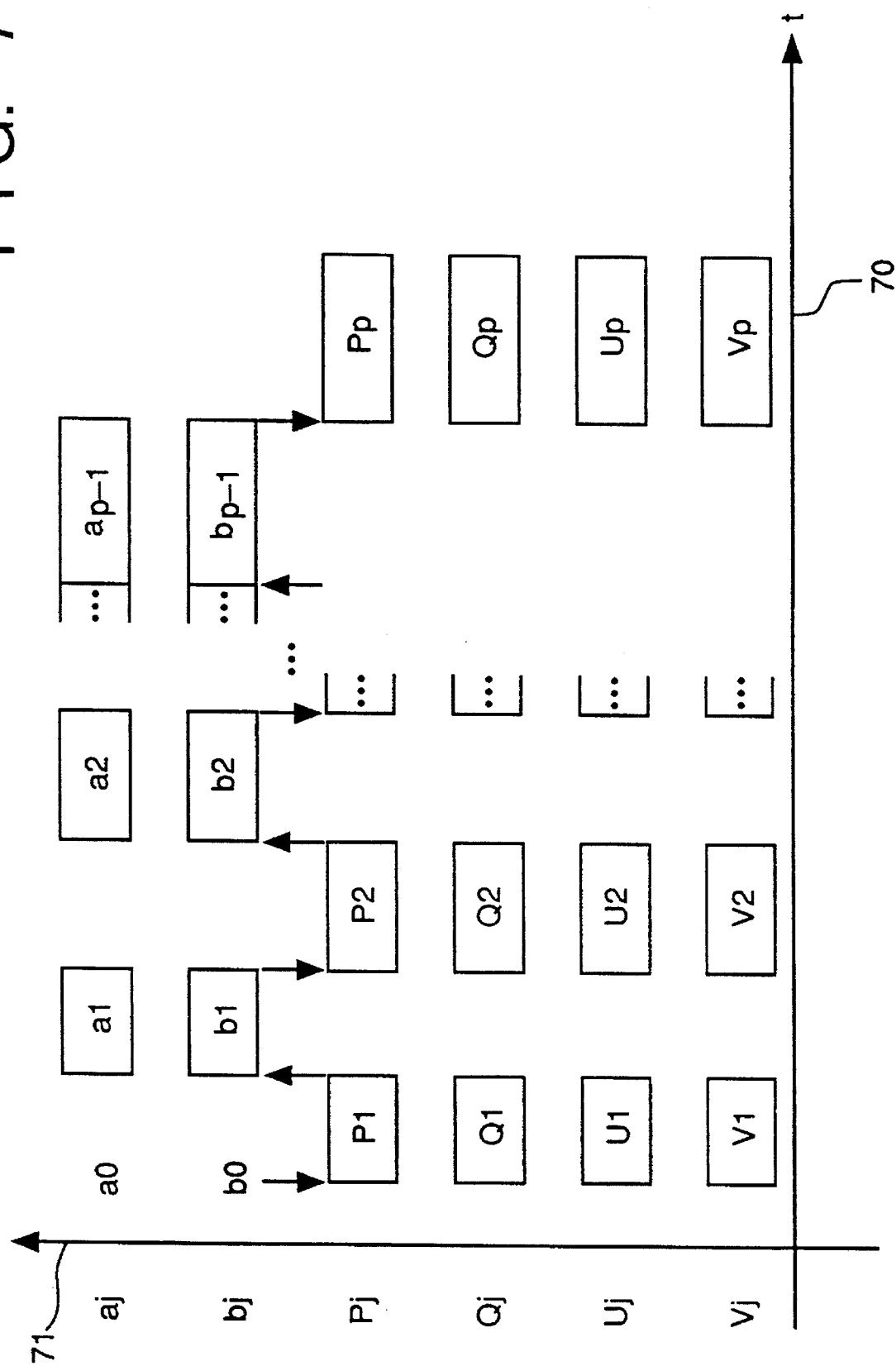
FIG. 7 is a view for explaining the procedures of decoding processing based on a WB algorithm.

It is difficult for the above-mentioned WB algorithm to parallelly calculate the j-th degree polynomials (Uj(x), Vj(x), Pj(x), Qj(x)) and (j+1)-th degree polynomials ($U_{j+1}$(x), $V_{j+1}$(x), $P_{j+1}$(x), $Q_{j+1}$(x)). This is because calculations of the (j+1)-th degree polynomials require aj and bj, and aj and bj are calculated using all the coefficients of the j-th degree polynomials. Therefore, since aj and bj are obtained after completion of calculations of the j-th degree polynomials, the calculations of the (j+1)-th degree polynomials can only be started thereafter. Therefore, as shown in FIG. 7, in the WB algorithm, updating calculations of the polynomials are sequentially performed. FIG. 7 is briefly described below. The time base of the calculations is plotted along an abscissa 70. Variables for decoding processing using the WB algorithm are plotted along an ordinate 71. The calculation order is as follows. First, $a_0$ and $b_0$ are calculated, and $P_1$, $Q_1$, $U_1$, and $V_1$ are then calculated using these values. Then, $a_1$ and $b_1$ are calculated from $P_1$, $Q_1$, $U_1$, and $V_1$. Following the same procedures, $P_2$, $Q_2$, $U_2$, and $V_2$ are calculated to calculate $a_2$ and $b_2$, ..., and finally, $P_p$, $Q_p$, $U_p$, and $V_p$ are calculated.

Such recurrence calculation procedures also apply to the above-mentioned recursive WB algorithm. Therefore, the WB algorithm and its recursive WB algorithm cannot achieve high-speed processing since they cannot perform parallel processing associated with updating of j.

Therefore, the third embodiment has as its object to provide a parallel decoding processing method which realizes high-speed decoding processing. The parallel decoding processing method of the third embodiment is described in detail below.

First, the following polynomials Aj(x) and Bj(x) are defined:

$$Aj(x)=Vj(x)-S(x)\cdot Uj(x)=\Sigma A_m \cdot X^m \tag{9}$$

$$Bj(x)=Qj(x)-S(x)\cdot Pj(x)=\Sigma B_m \cdot X^m \tag{10}$$

Therefore, aj and bj obtained in 3) in the WB algorithm are respectively given by:

$$aj=Aj(xj) \tag{11}$$

$$bj=Bj(xj) \tag{12}$$

Also, the following polynomials Z (x, y), C (x,y), and D (x,y) are defined:

$$Z(x,y) = \underset{m\ j}{\Sigma \Sigma} xj^m \cdot x^{v-n} \cdot y^j \tag{13}$$

(v is an arbitrary integer)

$$c(x,y) = A(x) \cdot Z(x,y) = \underset{i\ m\ j}{\Sigma \Sigma \Sigma} Ai \cdot xj^m \cdot x^{v-m+1} \cdot y^j \tag{14}$$

$$D(x,y) = B(x) \cdot Z(x,y) = \underset{i\ m\ j}{\Sigma \Sigma \Sigma} Bi \cdot xj^n \cdot x^{v-m+1} \cdot y^j \tag{15}$$

Therefore, as is seen from the above formulas, if i=m is set in formulas (14) and (15), aj and bj are ($x^v \cdot y^j$)-th degree coefficients of the polynomials C (x, y) and D (x,y).

On the other hand, C (x,y) and D (x,y) are updated as follows:

(a) When deg (aj $\cdot$Qj (x))<deg (bj$\cdot$Uj(x))
From $$V_{j+1}(x)=bj\cdot Vj(x)-aj\cdot Qj(x)$$

$$U_{j+1}(x)=bj\cdot Uj(x)-aj\cdot Pj(x)$$

$$Q_{j+1}(x)=(x-xj)\cdot Qj(x)$$

$$P_{j+1}(x)=(x-xj)\cdot Pj(x)$$

$A_{j+1}(x)$ and $B_{j+1}(x)$ are updated as follows:

$$A_{j+1}(x)=bj\cdot Aj(x)-aj\cdot Bj(x)$$

$$B_{j+1}(x)=(x-xj)\cdot Bj(x)$$

Therefore, in this case, C (x, y) and D (x, y) are updated as follows:

$$\begin{aligned}C_{j+1}(x,y) &= A_{j+1}(x)\cdot Z(x,y) \\ &= (bj\cdot Aj(x)-aj\cdot Bj(x))\cdot Z(x,y) \\ &= bj\cdot Cj(x,y)-aj\cdot Dj(x,y) \\ D_{j+1}(x,y) &= B_{j+1}(x)\cdot Z(x,y) \\ &= (x-xj)\cdot Bj(x)\cdot Z(x,y) \\ &= (x-xj)\cdot Dj(x,y)\end{aligned}$$

(b) When deg (aj$\cdot$Qj (x))$\geq$deg (bj$\cdot$Uj (x))
From $$Q_{j+1}(x)=bj\cdot Vj(x)-aj\cdot Qj(x)$$

$$P_{j+1}(x)=bj\cdot Uj(x)-aj\cdot Pj(x)$$

$$V_{j+1}(x)=(x-xj)\cdot Vj(x)$$

$$U_{j+1}(x)=(x-xj)\cdot Uj(x)$$

$A_{j+1}(x)$ and $B_{j+1}(x)$ are updated as follows:

$$A_{j+1}(x)=(x-xj)\cdot Aj(x)$$

$B_{j+1}(x) = bj \cdot Aj(x) - aj \cdot Bj(x)$

Therefore, in this case, C (x, y) and D (x, y) are updated as follows:

$$\begin{aligned}
C_{j+1}(x,y) &= A_{j+1}(x) \cdot Z(x,y) \\
&= (x-xj)Aj(x) \cdot Z(x,y) \\
&= (x-xj) \cdot Cj(x,y) \\
D_{j+1}(x,y) &= B_{j+1}(x) \cdot Z(x,y) \\
&= (bj \cdot Aj(x) - aj \cdot Bj(x)) \cdot Z(x,y) \\
&= (bj \cdot Cj(x,y) - aj \cdot Dj(x,y))
\end{aligned}$$

Therefore, since aj and bj are $(xv \cdot yj)$-th degree coefficients of the polynomials Cj (x, y) and Dj (x,y) without calculations in (3) in formula the WB algorithm described in the first embodiment, the WB algorithm is modified as follows:

```
[Decoding Algorithm of Third Embodiment]
j = 0, C_0(x,y) = -S(x) · Z(x,y), D_0(x,y) = Z(x,y)      100)
V_0(x) = 0, P_0(x) = 0, U_0(x) = 1, Q_0(x) = 1
if j = p then end                                        200)
set(x^v · y^j)-th degree coefficient of Cj(x,y) to be    300)
aj
set(x^v · y^j)-th degree coefficient of Dj(x,y) to be
bj
if aj = 0 then bj = 1
if deg(aj · Qj(x)) < deg(bj · Uj(x)) then                400)
  C_{j+1}(x,y) = bj · Cj(x,y) - aj · Dj(x,y)
  U_{j+1}(x) = bj · Uj(x) - aj · Pj(x)
  V_{j+1}(x) = bj · Vj - aj · Qj(x)
  D_{j+1}(x,y) = (x - xj) · Dj(x,y)
  P_{j+1}(x) = (x - xj) · Pj(x)
  Q_{j+1}(x) = (x - xj) · Qj(x)
else
  D_{j+1}(x,y) = bj · Cj(x,y) - aj · Dj(x,y)
  P_{j+1}(x) = bj · Uj(x) - aj · Pj(x)
  Q_{j+1}(x) = bj · Vj(x) - aj · Qj(x)
  C_{j+1}(x,y) = (x - xj) · Cj(x,y)
  U_{j+1}(x) = (x - xj) · Uj(x)
  V_{j+1}(x) = (x - xj) · Vj(x)
j = j + 1 goto 200                                       500)
```

Figure 8:
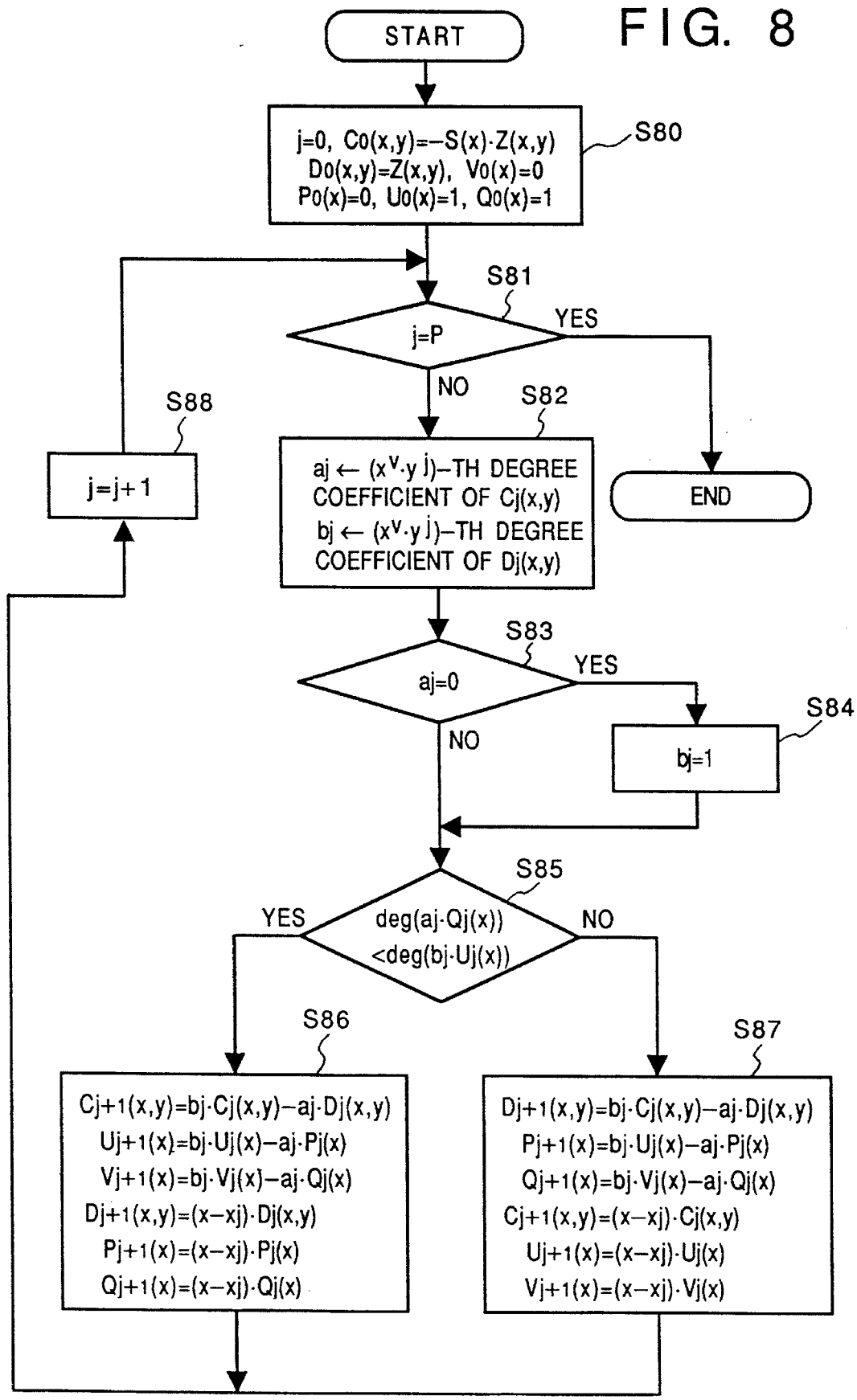
FIG. 8 is a flow chart for explaining parallel decoding processing according to the third embodiment of the present invention.

FIG. 8 is a flow chart showing the decoding processing of the above-mentioned decoding algorithm of the third embodiment. The decoding processing is described below with reference to this flow chart.

In step S80, a variable j for counting the number of times of processing is initialized, i.e., "j=0". Also, the polynomials $C_0(x, y)$, $D_0(x,y)$, $V_0(x)$, $P_0(x)$, $U_0(x)$, and $Q_0(x)$ are initialized.

In step S81, the variable j for counting the number of times of processing is compared with a predetermined number p of times of repetition, and if j=p, the decoding processing ends. Otherwise, the flow advances to step S82.

In step S82, the $(x^v \cdot y^j)$-th degree coefficient of Cj(x,y) is set to be aj. Also, the $(x^v \cdot y^j)$-th degree coefficient of Dj(x,y) is set to be bj.

In step S83, it is checked if aj=0. If aj=0, the flow advances to step S84 to set bj=1.

In step S85, the degree of aj·Qj(x) is compared with the degree of bj·Uj(x). If the degree of aj·Qj(x) is smaller than the degree of bj·Uj(x), the flow advances to step S86; otherwise, the flow advances to step S87.

In steps S86 and S87, the updating calculations of the polynomials described in the corresponding steps in FIG. 8 are executed.

In step S88, j is incremented by 1, and the flow returns to step S81 to repeat the above processing.

Figure 9:
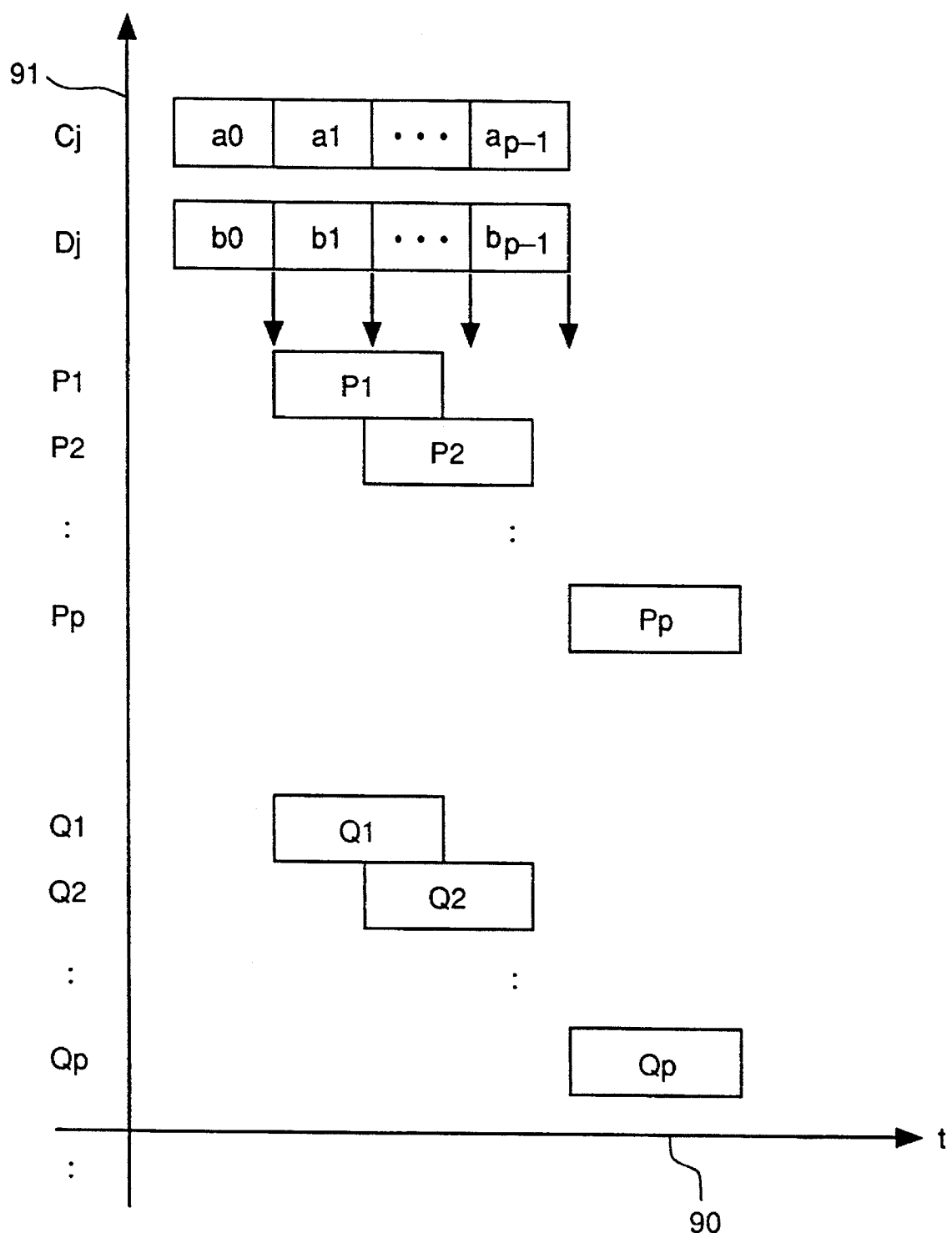
FIG. 9 is a view for explaining parallel processing of the parallel decoding processing of the third embodiment.
Figure 10:
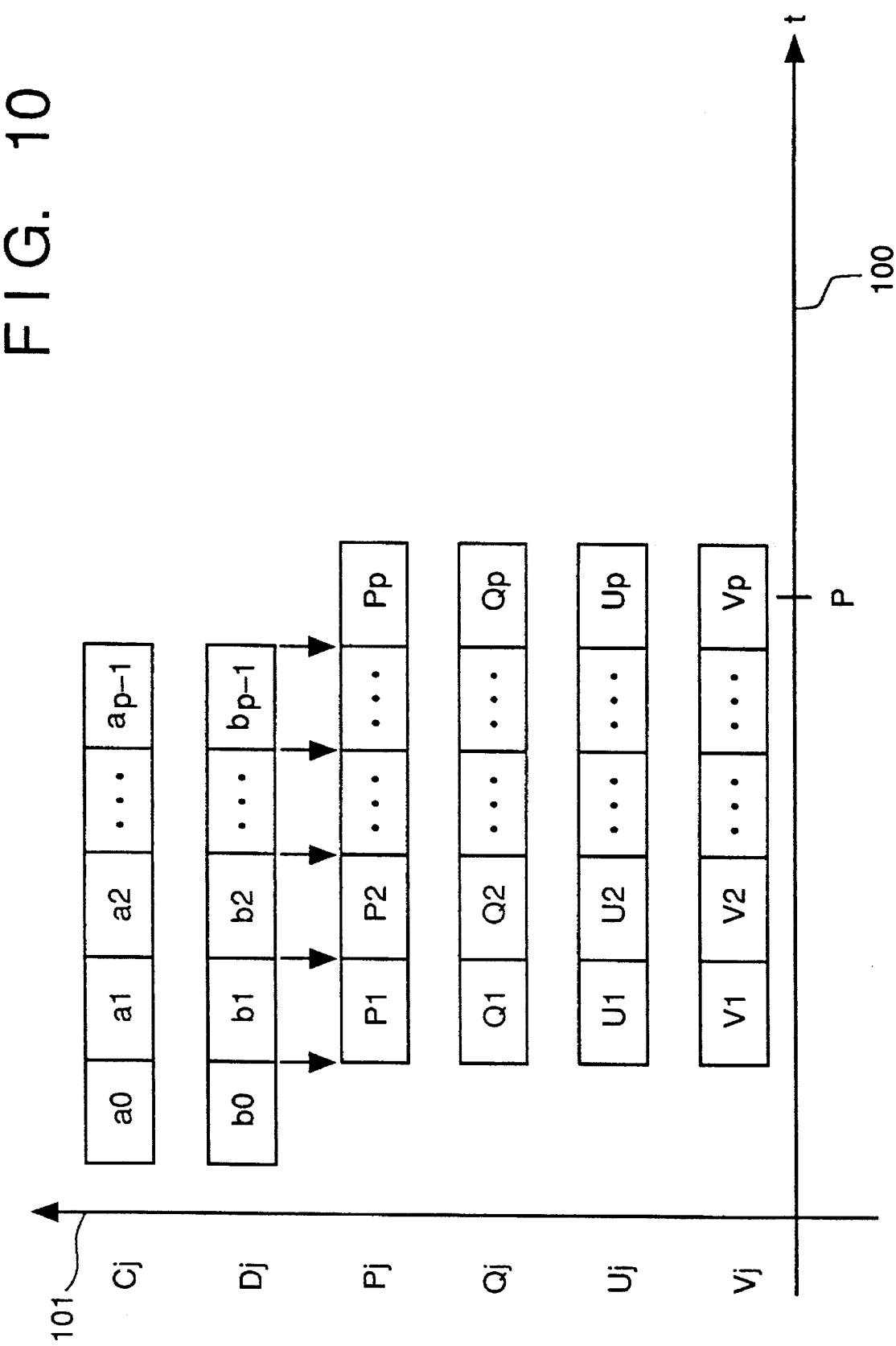
FIG. 10 is a view for explaining parallel processing of the parallel decoding processing of the third embodiment.

In the decoding method according to the third embodiment described above, parallel processing associated with j is performed. In the decoding processing of the third embodiment, aj and bj are the $(x^v \cdot y^j)$-th degree coefficients of Cj(x,y) and Dj(x,y). If $C_{j+1}(x,y)$ or $D_{j+1}(x,y)$ is sequentially calculated from higher degrees toward lower degrees using Cj (x, y) and Dj (x,y), the calculations of the (j+1)-th degree polynomials is started when the $(x^v \cdot y^j)$-th degree coefficients of Cj(x,y) and Dj(x,y) are obtained. This means that parallel calculations of j-th degree polynomials and (j+1)-th degree polynomials are performed. Therefore, in the decoding method of the third embodiment, the calculations of the j-th degree polynomials are parallelly executed, as shown in FIG. 9. In FIG. 9, the time base of the calculations is plotted along an abscissa 90. Also, variables for the third decoding processing are plotted along an ordinate 91. As is seen from FIG. 9, in the decoding processing of the third embodiment, if a plurality of processing circuits for performing updating calculations of polynomials are prepared, the processing speed is easily increased in proportion to the number of processing circuits. Even when the updating calculation of each j-th degree polynomials is performed by one clock, the calculation time requires only about p clocks, as shown in FIG. 10, and higher-speed calculations than those based on the conventional WB algorithm is realized. Note that the time base of the calculations is plotted along an abscissa 100 in FIG. 10. In addition, variables for the third decoding processing are plotted along an ordinate 101.

Therefore, the decoding processing of the third embodiment is realized by, e.g., an apparatus shown in FIG. 11 The respective processing units are described below.

A memory 110 stores initial values and their updated values set in step S80. The memory 110 is accessed by a control circuit 112 and a polynomial calculation processing circuit 111, as needed.

The control circuit 112 performs the following control. That is, a1: It is checked if j is equal to the predetermined number p of times of processing, and if j is not equal to p, the processing in step S82 is selected.

a2: It is checked if aj is equal to 0, and if aj=0, bj=1.

a3: If aj is not equal to 0, the degree discrimination in step S85 is performed, and the processing in step S86 or S87 is selected in accordance with the discrimination result. After the processing is selected, execution of the selected processing is requested for the polynomial calculation processing circuit 111. The polynomial calculation processing circuit 111 executes the selected processing in accordance with the request.

The polynomial calculation processing circuit 111 executes the selected processing, i.e., calculation processing in step S86 or S87, on the basis of the processing request from the control circuit 112.

Note that the control circuit 112 and the polynomial calculation processing circuit 111 need not be separated since they can be executed in a software manner using, e.g., a CPU. Since calculations required in the control circuit 112 and the polynomial calculation processing circuit 111 are simple multiplications/divisions and additions/subtractions of integers, no special processing circuit is required.

Since the updating calculations of $P_{j+1}(x)$, $Q_{j+1}(x)$, $U_{j+1}(x)$, $V_{j+1}(x)$, $C_{j+1}(x)$, and $D_{j+1}(x)$ can be simultaneously executed, a plurality of processing circuits may be independently arranged. Alternatively, since the updating calculations of polynomials are achieved by similar processing, they can be executed by a single circuit. As can be understood from the above description, the circuit arrangement for executing the decoding processing of the third embodiment is simplified.

Note that the modification technique of the WB algorithm described in the decoding method of the third embodiment can be applied to the recursive algorithm described in "Recursive Structure of Welch-Berlekamp Algorithm (IT91-100)" described above, and high-speed parallel processing of the recursive WB algorithm can be achieved.

$Cj(x,y)$ and $Dj(x,y)$ are used for calculating aj and bj as their $(x^v \cdot y^j)$-th degree coefficients, and other coefficients are not necessary. Therefore, as described in a well-known continued fraction method (see L. R. Welch and R. A. Scholtz: "Continued fractions and Berlekamp's algorithm", IEEE Trans. Inf. Theory, IT-25, pp. 19–27, January 1979), calculations which are not related to the final result can be omitted, and the total computational complexity can be reduced.

Note that the present invention may be applied to either a system constituted by a plurality of devices or an apparatus consisting of a single device. Also, the present invention may be applied to a case wherein the invention is achieved by supplying a program to a system or apparatus, as a matter of course.

In general, a high-speed algorithm often means one with a reduced computational complexity. However, in order to realize high-speed processing, an approach which decreases the computational complexity of the algorithm and an approach which improves the degree of parallelism of the algorithm are available. This is because the processing time is shortened by simultaneously executing a plurality of processing operations by parallel processing. A large-scale parallel processing chip is easily realized due to the recent advance of VLSI techniques. Therefore, an algorithm with a high degree of parallelism is often suitable for high-speed processing. The third embodiment is an example of the invention made in consideration of the background that a parallel processing circuit is realized with low cost due to the advance of the VLSI techniques.

As described above, according to the decoding processing method of the third embodiment, higher-speed processing with a higher degree of parallelism than the conventional WB algorithm is realized. The conventional WB algorithm requires two different kinds of calculations, i.e., the updating calculations of polynomials and the substitution calculations for calculating aj and bj, while the decoding processing method of the third embodiment requires only the updating calculations of polynomials, thus realizing a simple communication apparatus which can perform high-speed decoding.

(Fourth Embodiment)

In the first to third embodiments, the decoding method and apparatus for communication codes have been described. In the fourth embodiment, an example of a communication apparatus which comprises these decoding method and apparatus is described.

FIG. 12 is a schematic block diagram showing the arrangement of a communication apparatus 120 according to the fourth embodiment. The communication apparatus 120 of the fourth embodiment is described below with reference to FIG. 12.

A CPU 121 controls the entire communication apparatus 120. A control program is pre-stored in a ROM 124, and the CPU 121 executes this control program. A keyboard 122 is an input terminal for inputting commands and data for the communication apparatus 120. A RAM 123 stores work data and communication data with which the CPU 121 executes various kinds of processing. A monitor 125 displays various kinds of processing results in the communication apparatus 120, communication data, input commands from the keyboard 122, and the like. An encoder 127 performs encoding processing of communication data stored in the RAM 123, and outputs encoded data to a communication line 129. A decoder 126 decodes encoded data transmitted from an external communication apparatus via a communication line 128, and stores decoded data in the RAM 123.

Note that the decoder 126 is a portion for performing decoding processing based on the decoding method of one of the first to third embodiments. The decoder 126 includes a CPU A 130 for controlling the decoding processing, and a memory 131 which stores a decoding program corresponding to the decoding method.

In the communication apparatus of the fourth embodiment, received encoded data is decoded at high speed.

Note that the present invention may be applied to either a system constituted by a plurality of devices or an apparatus consisting of a single device. Also, the present invention may be applied to a case wherein the invention is achieved by supplying a program to a system or apparatus, as a matter of course.

As described above, according to the present invention, communication codes are decoded at high speed with a minimum computational complexity.

According to another aspect of the present invention, communication codes are decoded at high speed.

As many apparently widely different embodiments of the present invention can be made without departing from the spirit and scope thereof, it is to be understood that the invention is not limited to the specific embodiments thereof except as defined in the appended claims.

What is claimed is:

1. A communication apparatus for decoding an encoded received word, comprising:

syndrome polynomial generating means for generating a syndrome polynomial on the basis of a received word;

polynomial updating means for sequentially updating an error locator polynomial and an error evaluator polynomial which are set, a predetermined number of times, using the generated syndrome polynomial;

decoded sequence generating means for generating a decoded sequence on the basis of the error locator polynomial and the error evaluator polynomial updated the predetermined number of times;

degree calculating means for calculating a degree of the latest error locator polynomial; and comparison means for comparing the degree of the latest error locator polynomial with a predetermined threshold value, wherein said polynomial updating means updates the latest error locator polynomial and the latest error evaluator polynomial in a way of updating corresponding to the result of the comparison by said comparison means.

2. A communication apparatus for decoding a coded received word, comprising:

syndrome polynomial generating means for generating a syndrome polynomial on the basis of a received word;

polynomial updating means for sequentially updating an error locator polynomial and an error evaluator polynomial which are set, a predetermined number of times, using the generated syndrome polynomial, on the basis of an erasure position of the received word;

decoded sequence generating means for generating a decoded sequence on the basis of the error locator polynomial and the error evaluator polynomial updated the predetermined number of times;

degree calculating means for calculating a degree of the latest error locator polynomial; and comparison means for comparing the degree of the latest error locator polynomial with a predetermined threshold value, wherein said polynomial updating means updates the latest error locator polynomial and the latest error evaluator polynomial in a way of updating corresponding to the result of the comparison by said comparison means.

3. A communication method for decoding a coded received word, comprising:

a syndrome polynomial generating step of generating a syndrome polynomial on the basis of a received word;

a polynomial updating step of sequentially updating an error locator polynomial and an error evaluator polynomial which are set, a predetermined number of times, using the generated syndrome polynomial;

a decoded sequence generating step of generating a decoded sequence on the basis of the error locator polynomial and the error evaluator polynomial updated the predetermined number of times;

a degree calculating step of calculating a degree of the latest error locator polynomial; and a comparison step of comparing the degree of the latest error locator polynomial with a predetermined threshold value, wherein at said polynomial updating step the latest error locator polynomial and the latest error evaluator polynomial are updated in a way of updating corresponding to the result of the comparison at said comparison step.

4. A communication method for decoding an encoded received word, comprising:

a syndrome polynomial generating step of generating a syndrome polynomial on the basis of a received word;

a polynomial updating step of sequentially updating an error locator polynomial and an error evaluator polynomial which are set, a predetermined number of times, using the generated syndrome polynomial, on the basis of an erasure position of the received word;

a decoded sequence generating step of generating a decoded sequence on the basis of the error locator polynomial and the error evaluator polynomial updated the predetermined number of times;

a degree calculating step of calculating a degree of the latest error locator polynomial; and a comparison step of comparing the degree of the latest error locator polynomial with a predetermined threshold value, wherein at said polynomial updating step the latest error locator polynomial and the latest error evaluator polynomial are updated in a way of updating corresponding to the result of the comparison at said comparison step.

5. The method according to claim 4, wherein at the polynomial updating step, a first polynomial is generated based on the erasure position of the received word, and a second polynomial is generated based on the syndrome polynomial and the erasure position, and the error locator polynomial, the error evaluator polynomial, the first polynomial, and the second polynomial are updated on the basis of a coefficient of a predetermined degree of the first polynomial and a coefficient of a predetermined degree of the second polynomial.

6. The apparatus according to claim 1, wherein the predetermined threshold value is determined based on the times of updating performed by said polynomial updating means.

7. The apparatus according to claim 2, wherein the predetermined threshold value is determined based on the times of updating performed by said polynomial updating means.

8. The method according to claim 3, wherein the predetermined threshold value is determined based on the times of updating performed at said polynomial updating step.

9. The method according to claim 4, wherein the predetermined threshold value is determined based on the time of updating performed at said polynomial updating step.

* * * * *

UNITED STATES PATENT AND TRADEMARK OFFICE
CERTIFICATE OF CORRECTION

PATENT NO. : 5,604,752

DATED : February 18, 1997

INVENTOR(S) : KEIICHI IWAMURA

Page 1 of 3

It is certified that error appears in the above-identified patent and that said Letters Patent is hereby corrected as shown below:

On the title page:

AT [56] REFERENCES CITED

Other Publications, in "Continued Fractions...etc."
"Moriit Araki," should read --Morii & Araki,--.

COLUMN 1

Line 17, "hard-deciding" should read --hard-decoding--.
Line 50, "method" should read --method and--.
Line 54, "decode" should read --decodes--.

COLUMN 4

Line 5, "correction" should read --correction of--.
Line 6, "of" should be deleted.
Line 52, "abovementioned" should read --above-mentioned--.

COLUMN 5

Line 10, "$a_j$=0or deg Qj(x)<deg Uj(x)" should read
--$a_j$=0 or deg Qj(x)<deg Uj(x)--.
Line 11, "(5)" should read --(5),--.
Line 12, "," should be deleted.
Line 23, "in" should be deleted.
Line 57, "Qj (x) ," should read --Qj (x),--.

COLUMN 6

Line 6, "Qj (xj) ," should read --Oj (xj),--.
Line 23, "can be" should read --is--.

UNITED STATES PATENT AND TRADEMARK OFFICE
CERTIFICATE OF CORRECTION

PATENT NO.  : 5,604,752
DATED       : February 18, 1997
INVENTOR(S) : KEIICHI IWAMURA It is certified that error appears in the above-identified patent and that said Letters Patent is hereby corrected as shown below:

COLUMN 8

Line 12, ""j/2"" should read --"j/2".--.

COLUMN 11

Line 11, "= (bj·Cj(x,y)-aj·Dj(x,y)" should read
         --= bj·Cj(x,y)-aj·Dj(x,y)--.
Line 15, "in (3) in formula" should read
         --in formula (3)--.

COLUMN 12

Figure 11:
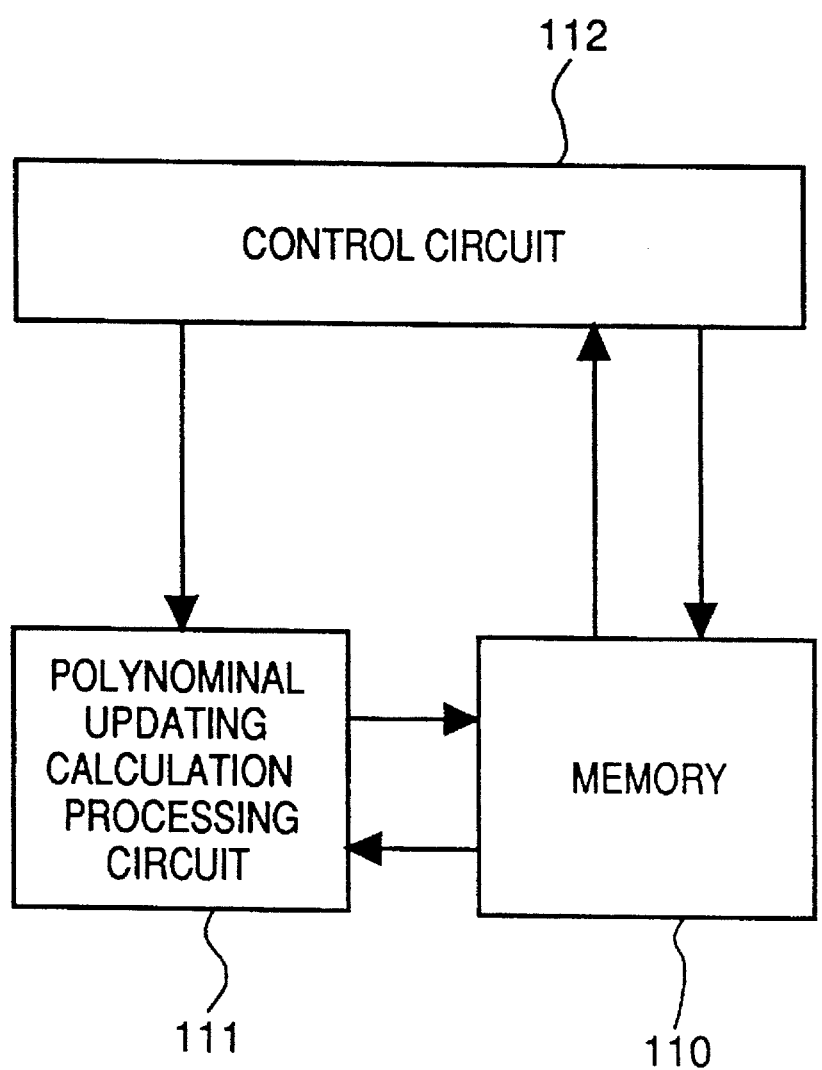
FIG. 11 is a block diagram for explaining the arrangement of a parallel decoding processing circuit of the third embodiment.

Line 26, "FIG. 11" should read --FIG. 11.--.

COLUMN 13

Line 41, "for." should read --for--.

COLUMN 14

Line 26, "at" should read --at a--.

UNITED STATES PATENT AND TRADEMARK OFFICE
CERTIFICATE OF CORRECTION

PATENT NO. : 5,604,752

DATED : February 18, 1997

INVENTOR(S) : KEIICHI IWAMURA

It is certified that error appears in the above-identified patent and that said Letters Patent is hereby corrected as shown below:

COLUMN 16

Line 39, "time" should read --times--.

Signed and Sealed this

Fourteenth Day of October, 1997

*Attest:*

BRUCE LEHMAN

*Attesting Officer*   Commissioner of Patents and Trademarks